United States Patent

Peluso et al.

[15] 3,671,812

[45] June 20, 1972

[54] HIGH DENSITY PACKAGING OF ELECTRONIC COMPONENTS IN THREE-DIMENSIONAL MODULES

[72] Inventors: Raymond F. Peluso; Richard F. David, both of Littleton, Colo.

[73] Assignee: Martin Marietta Corporation, Friendship International Airport, Md.

[22] Filed: July 1, 1970

[21] Appl. No.: 51,442

[52] U.S. Cl. ........................317/118, 174/68.5, 174/DIG. 3, 339/17 CF

[51] Int. Cl. ........................................H02b 1/04, H05k 1/14

[58] Field of Search ....................174/DIG. 3, 68.5; 317/100, 317/101 CM, 101 CW, 101 DH, 101 CC, 117, 118; 339/17 CF

[56] References Cited

UNITED STATES PATENTS

| | | | |
|---|---|---|---|
| 3,416,348 | 12/1968 | Carter | 174/DIG. 3 |
| 3,325,766 | 6/1967 | Kolb | 174/DIG. 3 |
| 3,368,114 | 2/1968 | Campbell | 317/101 A |
| 3,316,455 | 4/1967 | Hucke | 317/100 |
| 3,290,637 | 12/1966 | Yuska | 317/101 CC |
| 3,478,251 | 11/1969 | Perotto | 317/101 CC |
| 3,515,949 | 6/1970 | Michaels | 317/101 CW |
| 3,501,582 | 3/1970 | Heidler | 174/52.6 |
| 3,259,804 | 7/1966 | Parstorfer | 317/100 |

FOREIGN PATENTS OR APPLICATIONS

| | | | |
|---|---|---|---|
| 1,528,076 | 6/1968 | France | 339/17 LF |

*Primary Examiner*—Lewis H. Myers
*Assistant Examiner*—Gerald P. Tolin
*Attorney*—Phillip L. De Arment and Gay Chin

[57] ABSTRACT

A high density three-dimensional package of flatpacks in which the flatpacks are stacked in a cordwood configuration and in which rigid pins carried at opposite ends of each flatpack are plugged into appropriate sockets in circuit boards in a pressure fit relationship. A double right angle connector is also plugged into the circuit boards. Each of the flatpacks may be removed, replaced or repaired by merely unplugging it from the circuit boards. A combined housing and heat sink is also disclosed.

7 Claims, 6 Drawing Figures

INVENTORS
RAYMOND F. PELUSO
RICHARD F. DAVID
BY Yount and Tarolli
ATTORNEYS

INVENTORS
RAYMOND F. PELUSO
RICHARD F. DAVID
BY Yount and Tarolli
ATTORNEYS

HIGH DENSITY PACKAGING OF ELECTRONIC COMPONENTS IN THREE-DIMENSIONAL MODULES

This invention relates to the packaging of electronic components and, more particularly, to a three-dimensional modular package which is readily repairable after functional testing and which has a high density of contact connectors and which can accommodate a large number of modules per unit volume.

The invention is particularly applicable to a cordwood assembly of flatpack modules and will be described with particular reference to a modular package of such components, although it is to be appreciated that certain aspects of the invention have broader application and may be used with functional modules other than those of a flatpack configuration, and may also be used in assemblies other than a cordwood or stacking type.

Circuit modules in a flatpack configuration are well known and are frequently used in many types of miniaturized electronic systems and circuits. These circuit modules normally contain a number of integrated circuits in chip form which are supported on a multi-layer substrate with each of the modules or flatpacks then being assembled in various desired combinations to form a composite system or circuit.

As the techniques for miniaturization of these modules or flatpacks have improved, it has become correspondingly important to provide a packaging system which not only provides the necessary electrical connections for a plurality of modules but also provides a package which is both compact and inexpensive. Three-dimensional packages or assemblies of modules have been previously employed but have not proven entirely satisfactory for several reasons.

One fundamental problem that has been experienced is that, when assembled, the typical prior art modular package is not readily susceptible either to repair or to changes in the circuit design. This results from the use of soldered or welded connections which, as a matter of economics, precludes any substantial alterations in the assembled package. Hence, after the package has been assembled and subjected to a test, any individual module which may not check out results in substantial difficulties in disassembling the package and repairing the nonfunctioning module. Moreover, the soldered connections effectively preclude design changes in the circuitry once the modules have been assembled and soldered.

Another problem relates to the basic objective of packaging as large a number of modules in as small a volume as possible. Obviously, the higher the density of contact connector pins per unit volume the more desirable is the packaging system. However, several factors have, as a practical matter, limited the number of modules which can be incorporated in a unit volume.

For example, one factor has been the physical problem of working with a multiplicity of very small units. When a large number of such small units are to be assembled, the handling, arranging and interconnecting of the units can become quite involved. While techniques have been evolved to facilitate the handling and interconnection of the units, none of these techniques has offered a satisfactory solution to repairing any one of the modules after it has been assembled.

Another factor which has caused a problem in attempting to achieve a high density package of modules has been that of heat removal. Since the dimensions of the modules are very small, the available surface area to effect heat transfer is also very small. When a high density of modules are to be incorporated in a package, the removal of the generated heat to maintain functional operation may become a severe problem. Any solution to this problem, to be effective, must not only provide adequate dissipation of the heat but also accomplish that end without either adversely affecting the repairability of the unit or significantly increasing either the size or the cost of the package.

It is the principal object of this invention to provide an improved three-dimensional modular package of electronic modules.

One important objective of this invention is to provide a three-dimensional modular package of electronic components in which any individual component in the package may be readily removed and replaced or repaired.

Another important objective of this invention is to provide a three-dimensional modular package of electronic components which has a higher density of contact connectors per unit volume than was heretofore possible to achieve.

A further objective of this invention is to provide a high density three-dimensional modular package which incorporates a detachable heat sink structure to facilitate the removal of generated heat but which does not prevent the repair of disassembly of the package.

Another object of this invention is to provide an improved module or flatpack which can be assembled in a package with a minimum of labor and without the necessity of either bending leads or soldering joints to make the necessary electrical connections.

The foregoing objectives are achieved by a modular package comprised of a plurality of modules in a flatpack configuration with each of the modules having a plurality of rigid pins in lieu of the usual flexible ribbon leads that have been employed heretofore. The rigid pins project from the flatpacks in a plane parallel to the plane of the flatpacks thereby enabling the flatpacks to be assembled in a cordwood or stacked relationship. The pins are fabricated from a sufficiently rigid material that enables each of the pins to be plugged into a pressure fit socket in a printed circuit board. The assembly further includes a high density connector which is also plugged into the printed circuit board with the configuration and design of the connector providing a substantially increased density of connector contact pins than was previously available.

The rigid pins used on the flatpack module comprise a bifurcated base portion which defines a pair of support arms adapted to be received on a supporting surface on the module and in electrical contact with a terminal pad. The pins further include a connector portion which projects from the base portion with the connector portion being offset from the axis of symmetry of the bifurcated portion. As assembled, a plurality of these pins are spaced along opposed edges of each flatpack with the connector portion of adjacent pins being offset one from the other.

The modular package may also include a combined heat sink and cover or housing assembly with the cover providing structural support for the package and including a plurality of fins which are adapted to be interleaved with the stacked modules to provide for conduction of heat from the flatpacks. The housing is detachably connected to the electronic components with connector pins on the connector being exposed so that the modular assembly may be plugged into appropriate sockets for interconnection with other circuitry.

Other objects, features and advantages of the invention will become more apparent upon a complete reading of the following description which, when taken with the attached drawings, discloses but a preferred embodiment of the invention.

Referring now to the drawings wherein like reference numerals indicate like parts in the various views.

Figures 1, 2:
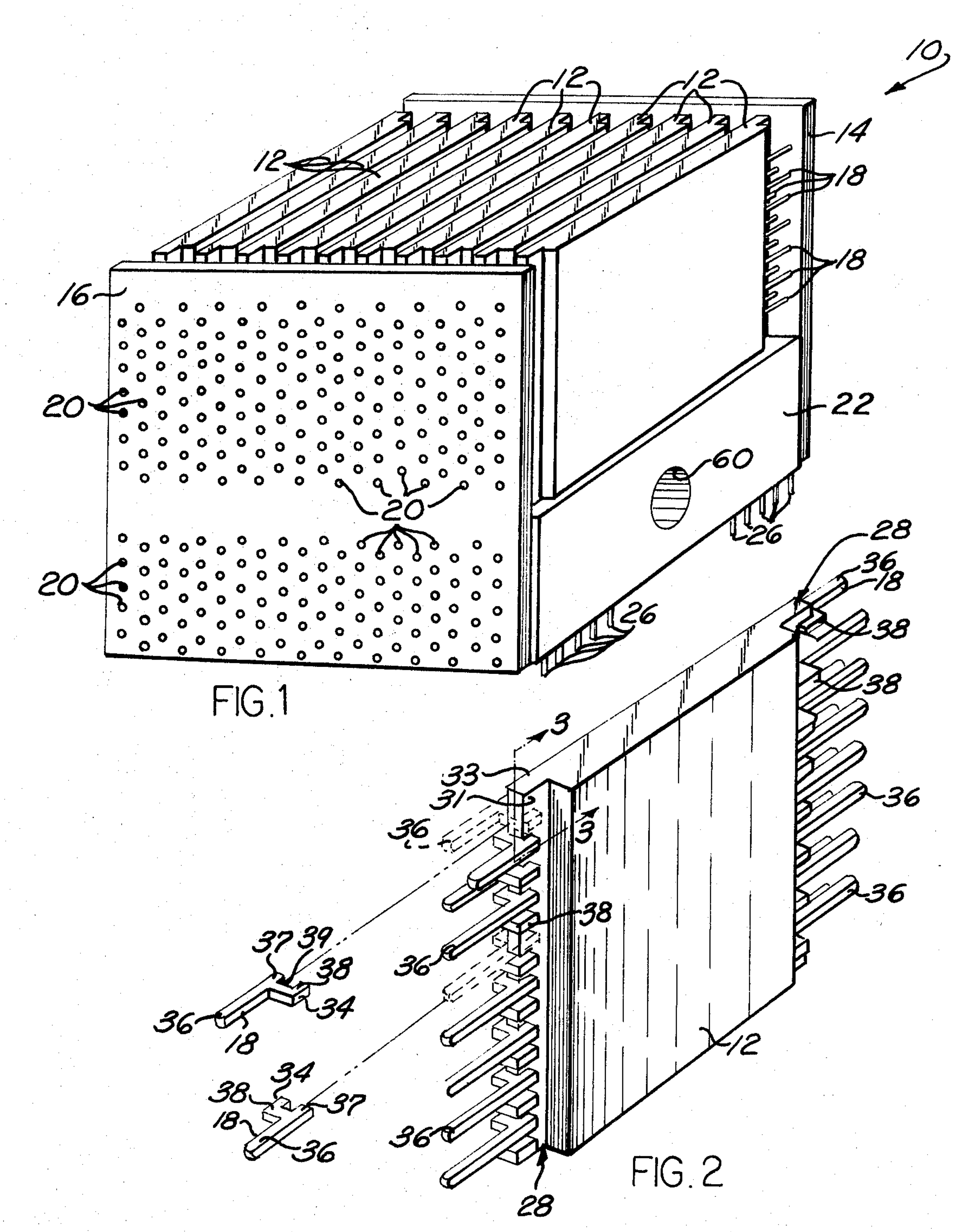
FIG. 1 is a perspective view of the three-dimensional modular package as assembled but with the cover removed.
FIG. 2 is a perspective view of one of the flatpack modules with a pair of the connector pins detached.

Referring now more in detail to the drawings wherein the showings are for the purpose of illustrating a preferred embodiment only and not for the purposes of limiting same, FIG. 1 illustrates a three-dimensional modular package constructed in accordance with the principles of this invention. As there illustrated, the package, indicated generally by the reference numeral 10, comprises a plurality of flatpack modules 12 assembled in a cordwood or stacked relationship between two printed circuit boards 14, 16. Each of the modules 12 includes a plurality of connector pins 18, to be described in detail hereinafter, with each of the pins 18 being receivable in appropriate pressure fit sockets 20 in the circuit boards.

The assembly further includes a connector block 22 having a plurality of connector pins 24 (See FIG. 4) projecting from either end thereof and received in the sockets 20 of the circuit boards 14, 16. The connector block also includes projecting pins 26 which extend at right angles to the pins 24 and which are also adapted to be plugged into appropriate sockets.

Referring now to the individual modules or flatpacks 12, each module may be made up in a manner well known in the art. For example, a number of integrated circuit chips may be bonded to and interconnected by a multi-layer thick-film substrate which normally consists of two or more metal layers separated by a double dielectric layer. If necessary or desired, other devices in chip form such as transistors, diodes or capacitors may be used within the module. After functional testing the module may be hermetically sealed in a conventional manner. This basic unit is preferably of a ceramic construction but may be metal or plastic as well.

Figure 3:
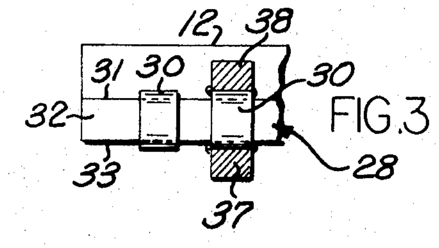
FIG. 3 is a fragmentary sectional view along line 3—3 of FIG. 2.

As illustrated, each module is of a generally rectangular configuration and has at opposite sides a stepped ledge or supporting surface 28 extending along the edge of the module. As best illustrated in FIG. 3, the chip devices internally of the module have electrical leads which terminate in a plurality of terminal pads 30. The pads 30 comprise a metallized layer which extends from the top surface 31 across the face 32 of the ledge 28 on the lower surface 33. However, it will be appreciated that other forms of terminal pads may be employed with that in FIG. 3 being merely exemplary of one form of such pad.

Cooperating with the ledge 28 and the individual terminal pads 30 are a plurality of connector pins 18. Each pin comprises a base portion 34 and a connector portion 36. As best illustrated in FIG. 2, the base portion 34 is bifurcated to define a pair of arms 37, 38 which form therebetween a ledge receiving opening 39. The opening 39 is dimensioned to receive the ledge 28 with the arms 37, 38 extending along the bottom and upper surfaces of the ledge. Each of the pins is secured to its associated metallized terminal pad by brazing or other appropriate means.

Again referring to FIG. 2, it is to be noted that the longitudinal axis of the connector portions 36 of each of the pins 18 is laterally offset from the axis of symmetry of the bifurcated arms 37,38. In other words, the connector portion 36 is offset toward one of the legs 37,38 and, as illustrated in FIG. 2, is in alignment with one of the legs thereby forming an "*h*" configuration.

The pins 18 are assembled on the ledge 28 in a regularly alternating pattern so that two rows of connector pins are provided for each end of the module 12. In this manner, the connector portions of adjacent pins are offset one from the other in a direction transverse to the plane of the flatpack. This alternating arrangement of pins spaces the tips of the pins in each row twice as far apart as the spacing of the pads on the ledge 28.

The pins 18 are fabricated from a rigid material such as half-hard beryllium copper. The pins may be stamped from a flat strip and a coining operation used to shape the connector portions 36 to a round configuration. The cold working of the material as the pins are formed increases the hardness of the material to approximately ¾ hard. By using a rigid material, the pins are adapted for use with a plug-in type of pressure fit socket and it is in this context that the terms "rigid" or "hard" are employed.

Figure 4:
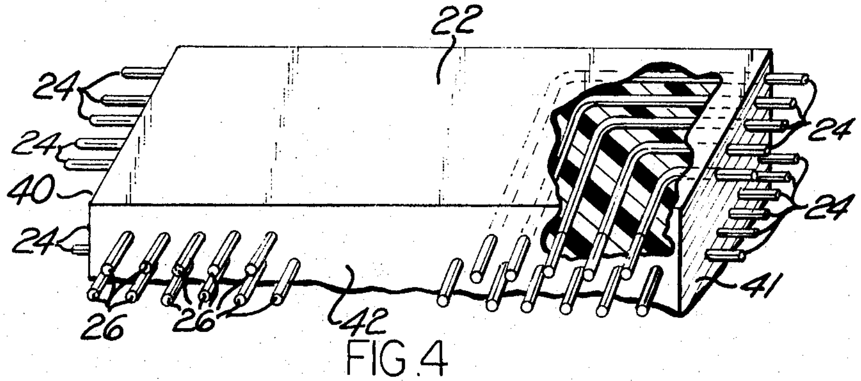
FIG. 4 is a fragmentary perspective view, partially in section, of the connector block.

Referring now to FIG. 4, the connector 22 is illustrated. As shown in that Figure, a double right-angle connector is used in which a plurality of connector pins are bent into a right-angle configuration and embedded in a plastic resin. As shown, each side 40,41 of the connector has a plurality of rows of pins 24 defined by the projecting ends of a plurality of rows of angle pins. The other projecting ends of these pins define a plurality of rows on the face 42 of the connector which is at right angles to the side edges 40, 41. With this arrangement, a high density of contact connectors is achieved in a minimum volume. For example, the connector 22 may provide as many as 200 connections in a connector body having dimensions of no greater than $1.25 \times 0.6 \times 1.7$ inches.

The circuit boards 14, 16 are multi-layer printed circuit boards with plated through holes on a hexagonal grid with all of the holes being the same distance from the adjacent hole thereby allowing printed circuit traces to run between any two adjacent holes. Other types of board may also be used such as glass-epoxy boards with holes connected by means of individual wires. A conventional pressure fit socket such as those commercially available from AMP Corporation is flow soldered into each hole on the boards 14, 16.

With the elements thus described, a compact three-dimensional modular package can be readily assembled, tested and disassembled for repair or for design changes. To assemble the package, a plurality of modules 12 each fabricated as shown in FIG. 2, are selected. The modules are assembled in cordwood fashion to one of the circuit boards 14 by plugging the pins 18 of each module into the sockets in that circuit board. The connector 22 is assembled to the same circuit board 14 by plugging the connector pins 24 into the sockets in that board. Thereafter, the other circuit board 16 is assembled to the opposite end of the modules 12 and connector 24 to form a compact package. As assembled, the circuit boards define the ends of the package and the planar surfaces of the two outermost modules define the sides. The top of the package is open to facilitate heat dissipation and the bottom of the package has exposed pins 26 which may be plugged into another circuit.

It will be appreciated that, when assembled, the described package can be tested and altered or repaired as desired. If the package is tested or otherwise placed in functional usage and either a faulty module is detected or a design change is desired, it is but a simple matter to detach one of the circuit boards 14,16 by simply pulling it away from the pressure fitting relationship with the pins 18 and 24. Thereafter, any one of the modules 12 may be removed and replaced and the circuit board reattached thereby rendering the package ready for further use.

This aspect of repairability is to be emphasized since it is becoming increasingly important. The miniaturized circuits now being used frequently employ many components and subunits, any one of which may require repair or replacement. With the modular package disclosed herein, it is apparent that the repair of any particular module is greatly facilitated. It is to be understood that the repairability concept with which this invention is concerned is to be distinguished from assemblies in which the leads and connections must be soldered or otherwise integrally connected before the assembled package can be either tested or placed in functional use. Assemblies of this latter type are sometimes considered to be repairable but require that the joints be unsoldered before disassembly and repair can be affected. That type of arrangement is not considered to be repairable in the sense of this invention since it involves a substantial amount of labor and time to disassemble the package. The impracticality of repairing that type of assembly is readily apparent when it is considered that over 200 soldered connections may be involved in each assembly.

If desired, after functional testing has been completed and the package is determined to be satisfactory, each of the pins 18 and 24 can be flow soldered into their respective sockets. This will produce a somewhat more rigid assembly and the advantages of soldered connections are obtained. However, it is to be emphasized that, except where soldered connections are required, the pressure fit relationship of the hard pins in their sockets is satisfactory for operation of the modular package. Moreover, soldered connections are not required for full functional testing of the modular package.

The foregoing described arrangement thus provides a compact modular assembly of electronic components which, as assembled, is fully repairable and provides a high density of contact connectors per unit volume. It has been calculated that the described modular package achieves a packing density 2.3 times as great as that obtainable with conventional printed circuit boards and conventional flatpacks. This desirable result is achieved by using rigid pins which are connected to the flatpacks in an orientation which facilitates cordwood assembly of the flatpacks and which are adapted to be plugged into pressure fitting sockets in the circuit boards thereby eliminating the need for soldered connections of the type heretofore employed.

Figure 5:
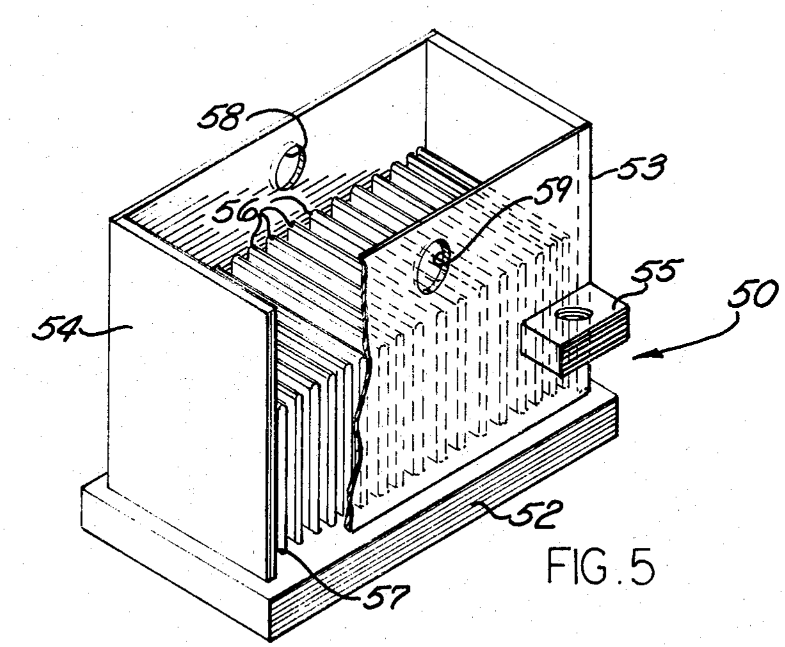
FIG. 5 is a perspective view of the combined cover and heat sink in an inverted position.
Figure 6:
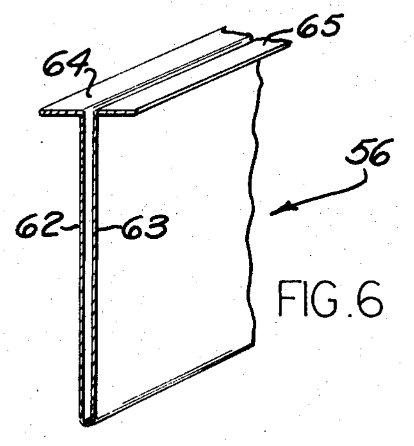
FIG. 6 is a fragmentary perspective view of one of the heat sink fins.

If additional cooling of the modules is desired, a combined heat sink and cover or housing may be employed. Such an assembly is illustrated in FIG. 5 and is indicated generally by the reference numeral 50. The cover assembly 50 comprises a top plate 52 and depending side plates 53,54. Each of the side plates 53, 54 includes a mounting lug 55. The assembly 50 further includes a metallic heat sink arrangement comprised of a plurality of metallic plates or fins 56 which extend through slotted apertures 57 formed in the top plate 52. As assembled, the heat sink plates or fins are adapted to be interleaved with the modules 12 so that the heat generated by the modules is absorbed by the fins on either side of each module.

The cover assembly is assembled on the modular package of FIG. 1 by inverting the cover from the position shown in FIG. 5 and assembling it over the modular package with the holes 58, 59 in the side plates 53, 54 being aligned with the threaded holes 60 on opposite sides of the connector block 22. The cover assembly is four-sided and covers the circuit boards, however, the circuit boards 14, 16 and the connector pins 26 could be exposed if different cover constructions were used. Screw fasteners may he inserted through the holes 58, 59 and threaded into the holes 60 to maintain the cover assembled to the package.

The fins 56 may take various forms but, as shown, are fabricated by folding a flat strip of material in a generally U-shaped configuration to define a pair of spaced apart panels or walls 62, 63. The upper end of each wall is bent at right angles outwardly in opposed directions to form flanges 64, 65. The fins 56 are assembled to the cover by inserting them through slots 57 in the top plate with the flanges 64, 65 resting on the upper surface of the plate to support the fins in a depending relationship.

Fins constructed as described are particularly desirable in a cordwood assembly in which the flatpacks may have substantial dimensional variations. Because of the flexibility of the walls 62, 63, the fins 56, when interleaved with the modules 12, are sufficiently flexible to compensate for any dimensional variations which may occur.

It will be apparent from the foregoing that the objects of the invention have been fully accomplished by the disclosed modular package. Thus, a plurality of flatpacks are easily assembled in a cordwood assembly to provide maximum packing density. The soldered connections heretofore required have been eliminated and replaced by pressure fit socket connections which not only facilitate the assembly of the package but also its disassembly for repair or replacement of any one of the flatpacks. The invention minimizes the elements required to produce a package in that the printed circuit boards function as the sides of the package and the high density connector forms the base. If desired, a cover can be assembled to the package and, if required, a heat sink may be incorporated in the cover with neither the cover nor the heat sink inhibiting the ease with which the assembled package may be disassembled.

Although the principles of the invention have been set forth in connection with a preferred embodiment, it is not intended that the illustrated embodiment or the terminology employed in describing it is to be limiting but, rather, it is our desire to be restricted only by the scope of the appended claims.

Having thus described our invention we claim:

1. A high density three-dimensional modular package of electrical components comprising a plurality of electrical component packs, each of said packs including connector means supported thereon, circuit board means having a plurality of sockets formed therein receiving said connector means, a connector block having a first set of connector pins projecting from one surface thereof and received in sockets of said circuit board means, said connector block having a second set of connector pins electrically connected with said first set and extending from another surface of said connector block, each set of said pins being arranged in a plurality of rows along their respective surfaces to provide a high density of pins per unit of volume, wherein:
   said circuit board means comprises a pair of circuit boards, and said connector means comprises rigid pins having a pressure fit relationship with the sockets of said circuit boards.

2. A package as defined in claim 1 wherein said first and second sets of connector pins are rigid and said first set has a pressure fit relationship with one of said circuit boards.

3. A functional module for use in a modular assembly comprising a support member including an electrical system having a plurality of electrical terminals, and a plurality of connector pins, said connector pins each including a base portion supporting each of said pins on said support member in electrical contact with one of said terminals, each of said connector pins further including a rigid connector portion extending from said base portion and adapted to be pressure fit in an electrical socket, said pins being spaced along said support member with the connector portions of adjacent pins being offset one from the other to define a plurality of rows of pins, and said module having a flatpack configuration with said connector portions of said connector pins lying in planes parallel to the plane of the flatpack, said base portion of each of said connector pins being bifurcated to define a pair of arms which engage opposed surfaces on said module, said support member including a support ledge having a reduced thickness and projecting therefrom and with said electrical terminals extending into said ledge, said bifurcated arms of said base portions of said connector pins being received over said ledge.

4. A functional module for use in a modular assembly comprising a support member including an electrical system having a plurality of electrical terminals and a plurality of connector pins, said connector pins each including a base portion supporting each of said pins on said support member in electrical contact with one of said terminals, each of said connector pins further including a rigid connector portion extending from said base portion and adapted to be pressure fit in an electrical socket, said module having a flatpack configuration with said connector portions of said connector pins lying in planes parallel to the plane of the flatpack, said base portion of each of said connector pins being bifurcated to define a pair of arms which engage opposed surfaces on said module and said support member including a support ledge having a reduced thickness and projecting therefrom and with said electrical terminals extending into said ledge, said bifurcated arms of said base portions of said connector pins being received over said ledge.

5. A high density three-dimensional modular package of electrical components comprising a plurality of electrical component packs each having a flatpack configuration and arranged in a cordwood relationship, each of said flatpacks including an electrical system having a plurality of electrical terminals, a plurality of rigid connector pins projecting from opposite ends of each of said flatpacks in plane parallel to the planes of said flatpacks, means connecting each of said connector pins in electrical contact with one of the electrical terminals on its associated flatpack, and a pair of circuit boards each having a plurality of sockets formed therein, each of said connector pins projecting from one end of said flatpacks being received in a pressure fitting relationship in a corresponding socket in one of said circuit boards, each connector pin projecting from said one end of said flatpacks and its corresponding socket having abutting surface contact providing an electrical connection therebetween, each of said connector pins projecting from the other end of said flatpacks being received in a pressure fitting relationship in a corresponding socket in the other of said circuit boards, and each of said connector pins projecting from the other end of said flatpacks also having abutting surface contact with its corresponding socket providing an electrical connection therebetween whereby said flatpacks are each detachably plugged into said circuit board means and readily removable therefrom, wherein each of said flatpacks has a support ledge portion having a reduced thickness projecting therefrom and said electrical terminals extending into said ledge and said rigid connector pins comprising bifurcated arms received over said ledge at least one of which is electrically connected with said electrical terminal.

6. A package as defined in claim 5 further including a connector block having a first set of connector pins projecting from one surface thereof and received in sockets in one of said circuit boards and having a second set of connector pins projecting from the opposed surface thereof and received in sockets in the other of said circuit board means, said connector block having additional connector pins electrically connected with said first and second sets thereof and extending from a third surface thereof, each of said pins of the connector block being arranged in a plurality of rows along their respective surfaces to provide a high density of pins per unit of volume.

7. A package as defined in claim 5 further including a cover assembly positioned over said flatpacks, said cover assembly including a heatsink means supported thereon including fin portions positioned between the flatpacks for conducted heat removal.

* * * * *